United States Patent [19]
Arase

[11] Patent Number: 5,808,945
[45] Date of Patent: Sep. 15, 1998

[54] SEMICONDUCTOR MEMORY HAVING REDUNDANT MEMORY ARRAY

[75] Inventor: Kenshiro Arase, Kanagawa, Japan

[73] Assignee: Sony Corporation, Japan

[21] Appl. No.: 802,610

[22] Filed: Feb. 19, 1997

[30] Foreign Application Priority Data

Feb. 21, 1996 [JP] Japan .................................. 8-034078
Feb. 21, 1996 [JP] Japan .................................. 8-034079

[51] Int. Cl.$^6$ .................................................. G11C 13/00
[52] U.S. Cl. ...................................... 365/200; 365/230.01
[58] Field of Search .............................. 365/200, 189.01, 365/230.01

[56] References Cited

U.S. PATENT DOCUMENTS 5,659,509  8/1997  Bocca et al. .......................... 365/200

Primary Examiner—Terrell W. Fears
Attorney, Agent, or Firm—Ronald P. Kananen

[57] ABSTRACT

A semiconductor memory wherein memory cells are arranged in a matrix and word lines or bit lines have hierarchical structures, where the efficiency of redundancy is increased by replacing a defective memory cell existing in a column or row by a sub word line unit or a sub bit line unit.

18 Claims, 8 Drawing Sheets

SEMICONDUCTOR MEMORY HAVING
REDUNDANT MEMORY ARRAY

BACKGROUND OF THE INVENTION

1. Field of the Invention

The present invention relates to a semiconductor memory having a redundant memory array.

2. Description of the Related Art

In some semiconductor memories such as a static random access memory (SRAM), a dynamic random access memory (DRAM), a mask read only memory, an erasable programmable read only memory (EPROM), and a flash memory, when there are defective bits in the memory chip, the chip is generally saved in units of word lines or units of bit lines.

Namely, the defective chip is saved by replacing the word line containing the defective memory cell by a redundant word line or replacing the defective bit line by a redundant bit line.

In this way, however, even though it is sufficient to replace only a part of the word line or a part of the bit line, the entire word line or entire bit line is replaced, that is to say, all of the memory cells connected to the word line or the bit line containing the defective cell are replaced. Namely, even parts not requiring replacement are replaced. As a result, the utilization efficiency of the spare memory cells becomes low.

SUMMARY OF THE INVENTION

An object of the present invention is to provide a semiconductor memory which enables efficient use of redundant memory by replacing only part of a defective word line or bit line.

According to a first aspect of the present invention, there is provided a semiconductor memory which has a divided word line structure in which a main word line is divided into a plurality of sub word lines and which arranges memory cells at cross points between the main word line and bit lines arranged crossing the same, comprising at least one redundant main word line to which a plurality of redundant sub word lines are selectively connected, a defect address memory means for storing an address of a defective sub word line containing a defective memory cell, and a saving means for replacing a sub word line with a redundant sub word line existing in a direction in which the same bit line extends when the address of a memory cell connected to the sub word line coincides with an address stored in the defect address memory means.

Further, the saving means of the semiconductor memory has a selective main word line replacing means for replacing a defective main word line to which a defective sub word line is connected by a redundant main word line when a defective sub word line having the same address as a defect address stored in the defect address memory means is selected and not replacing the defective main word line when a sub word line having a different address from the defect addresses is selected.

According to a second aspect of the present invention, there is provided a semiconductor memory which has a divided bit line structure in which a main bit line is divided into a plurality of sub bit lines and which arranges memory cells at cross points between the main bit line and word lines arranged crossing the same, comprising at least one redundant main bit line to which a plurality of redundant sub bit lines are selectively connected, a defect address memory means for storing an address of a defective sub bit line containing a defective memory cell, and a saving means for replacing a sub bit line by a redundant sub bit line existing in a direction in which the same word line extends when an address of a memory cell connected to the sub bit line coincides with an address stored in the defect address memory means.

The saving means of the semiconductor memory has a selective main bit line replacing means for replacing a defective main bit line to which a defective sub bit line is connected by a redundant main bit line when a defective sub bit line having the same address as a defect address stored in the defect address memory means is selected and not replacing the defective main bit line when a sub bit line having a different address from the defect addresses is selected.

According to a third aspect of the present invention, there is provided a semiconductor memory comprising a plurality of NAND rows having a NAND structure connected to bit lines arranged in rows and memory transistors arranged in a matrix connected to the NAND rows and word lines, comprising at least one redundant bit line to which a plurality of redundant NAND rows are connected, a defect address memory means for storing an address of a defective sub NAND row containing a defective memory cell, and a saving means for replacing a NAND row by a redundant NAND row existing in a direction in which the same word line extends when there is a defect in the memory cells connected to the NAND row.

The saving means of the semiconductor memory has a selective main word line replacing means for replacing a defective main bit line to which a NAND row is connected by a redundant main bit line when a NAND row having the same address as a defective address stored in the defect address memory means is selected and not replacing the defective bit line when a NAND row having a different address from the defective addresses is selected.

The defect address memory means in the semiconductor memories of the present invention may be constituted by a nonvolatile memory device.

The memory array part and the defect address memory means are integrated separately.

The defect address is stored at the time of shipment of the products.

The semiconductor memory is rewritable and the defect address is recorded at every rewrite operation.

According to the semiconductor memory of the present invention, a word line is constituted by a hierarchical structure of a main word line and sub word lines or a bit line is constituted by a hierarchical structure of a main bit line and sub bit lines, therefore a memory chip containing a defective memory cell can be saved by in a word line unit or a bit line unit, but in a sub word line unit or a sub bit line unit obtained by dividing the word line or the bit line. As a result, it is possible to realize a semiconductor memory with a higher efficiency of redundancy.

More specifically, the address of a defective sub word line or a defective sub bit line is stored in the defect address memory means. Only when a defective sub word line or a defective sub bit line having the same address as one of the defect addresses is selected, the defective main word line or the defective main bit line are replaced by a redundant main word line or redundant main bit line by the selective main word line replacing means or the selective main bit line replacing means.

Further, according to the semiconductor memory of the present invention, a memory chip containing a defective memory cell is saved not in a bit line unit, but in a NAND row unit.

Concretely, the address of a defective NAND row is stored in the defect address memory means. Only when a defective NAND row having the same address as a defect address, the defective bit line is replaced by a redundant bit line by the selective main bit replacing means.

Further, by recording the defect addresses at the time of the testing for shipment of the products of the memory chips, it is possible to save the defective chips at the time of shipment of products of the memory chip.

Further, in a rewritable flash memory or the like, since defect addresses are recorded every rewrite operation, it is possible to prevent the occurrence of a defect by rewriting.

BRIEF DESCRIPTION OF THE DRAWING

These and other objects and features of the present invention will become more apparent from the following description of the preferred embodiments made with reference to the drawings, in which:

FIG. 3 is an explanatory view of redundancy given by a main bit line unit in a DINOR type flash memory of FIG. 2a;

DESCRIPTION OF THE PREFERRED EMBODIMENTS

Preferred embodiments of the present invention will now be explained in further detail with reference to the drawings.

Figure 1:
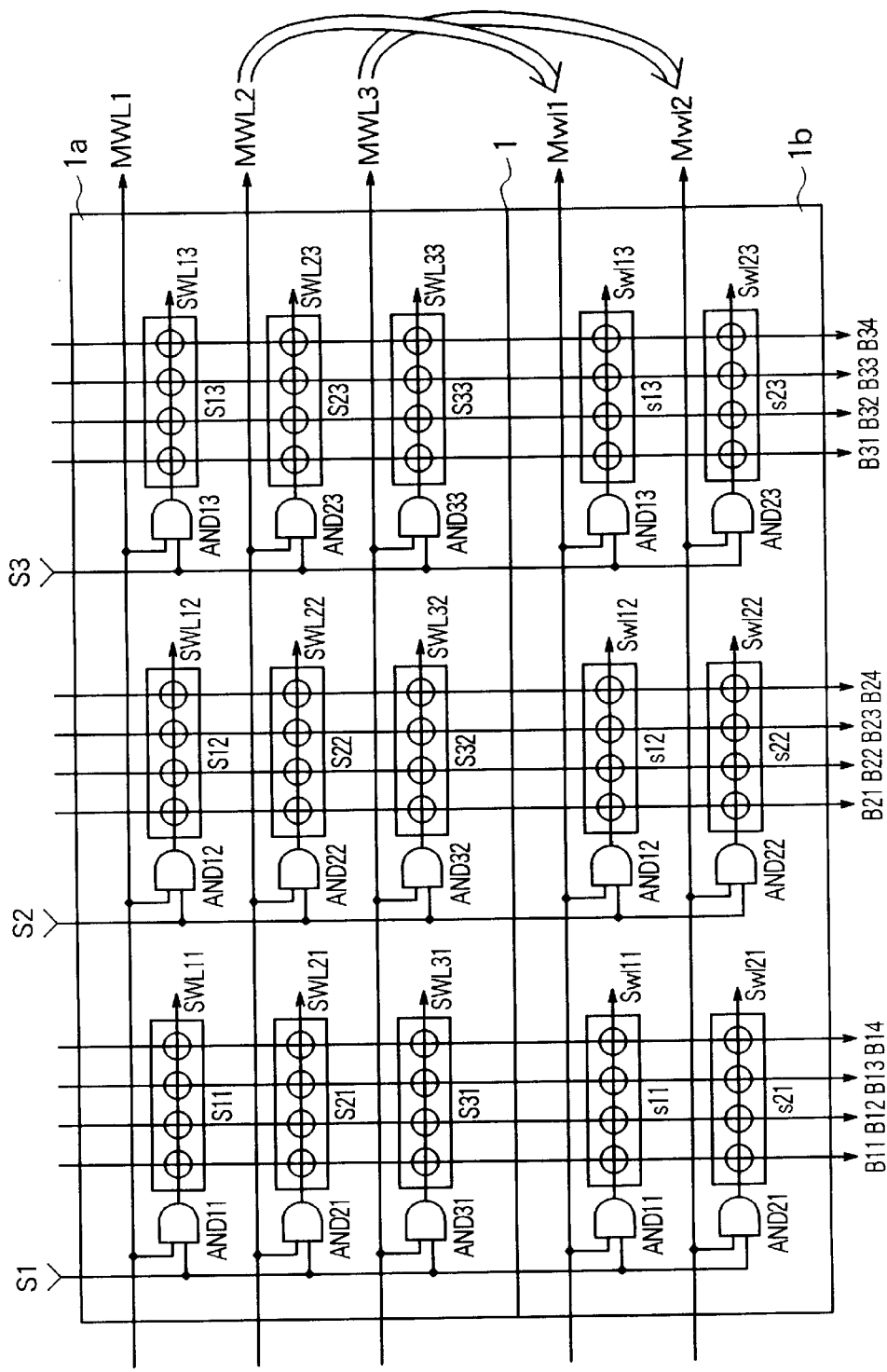
FIG. 1 is an explanatory view of replacement of a defective cell at the time of providing redundancy in units of main word lines.

FIG. 1 is an explanatory view of replacement of a defective cell by a redundant cell by a main word line unit in a semiconductor memory having a divided word line structure.

In FIG. 1, 1 represents a memory array constituted by a regular memory array 1a and a redundant memory array 1b.

Note that, as a matter of convenience, an example, in which three regular main word lines $MWL_1$ to $MWL_3$ are arranged in the regular memory array 1a and two redundant main word lines $Mwl_1$ and $Mwl_2$ are arranged in the redundant memory array 1b, is illustrated.

Each of the regular main word lines $MWL_1$ to $MWL_3$ and the redundant main word lines $Mwl_1$ and $Mwl_2$ are divided into three regular sub word lines $SWL_{11}$ to $SWL_{33}$ and redundant sub word lines $Swl_{11}$ to $Swl_{23}$ respectively.

Each of the sub word lines are arranged across four bit lines $B_{11}$ to $B_{34}$ and connected to a memory row (sub word line block) constituted by four memory cells (illustrated by ○ in FIG. 1).

Namely, the regular memory array 1a is constituted by the regular word line blocks $S_{11}$ to $S_{33}$, and the redundant memory array 1b is constituted by the redundant sub word line blocks $S_{11}$ to $S_{23}$.

$AND_{11}$ to $AND_{33}$ in the regular memory array 1a represent AND circuits for connecting operatively between the regular main word lines $MWL_1$ to $MWL_3$ and the regular sub word lines $SWL_{11}$ to $SWL_{33}$ and are selected operatively by select signals S1 to S3 from a sub row decoder (section decoder).

$AND_{11}$ to $AND_{23}$ in the redundant memory array 1b represent AND circuits for connecting operatively between the redundant main word lines $Mwl_1$ and $Mwl_2$ and the redundant sub word lines $Swl_{11}$ to $Swl_{23}$ and are selected operatively by select signals S1 to S3.

In the example of FIG. 1, there is a defect in one memory cell (illustrated by ○ in FIG. 1) in each of the regular sub word line blocks $S_{21}$, $S_{23}$, and $S_{32}$.

In this case, the two regular main word lines $MWL_2$ and $MWL_3$ are defective main word lines. The chip is saved by replacing the defective main word lines $MWL_2$ and $MWL_3$ by the redundant main word lines $Mwl_1$ and $Mwl_2$.

However, in the example of FIG. 1, in the regular sub word block connected to the defective word line $MWL_2$, while $S_{21}$ and $S_{23}$ are defective, $S_{22}$ is normal.

Namely, since redundancy is provided in units of main word lines, the normal sub word line block is replaced too. As a result, the efficiency of redundancy is reduced.

Figure 2C:
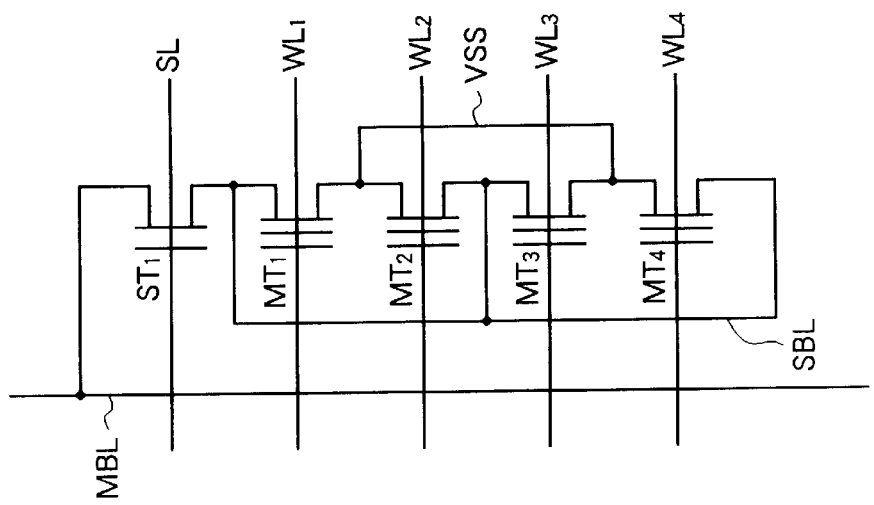
FIG. 2C is a view of a memory array of an AND type flash memory.
Figure 2B:
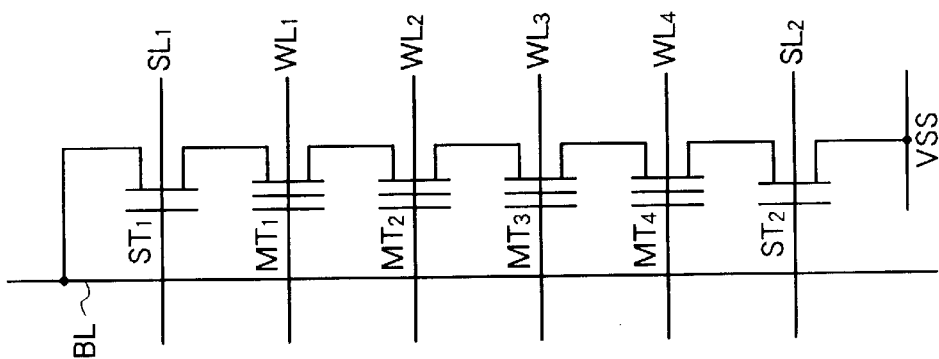
FIG. 2B is a view of a memory array of a NAND type flash memory.
Figure 2A:
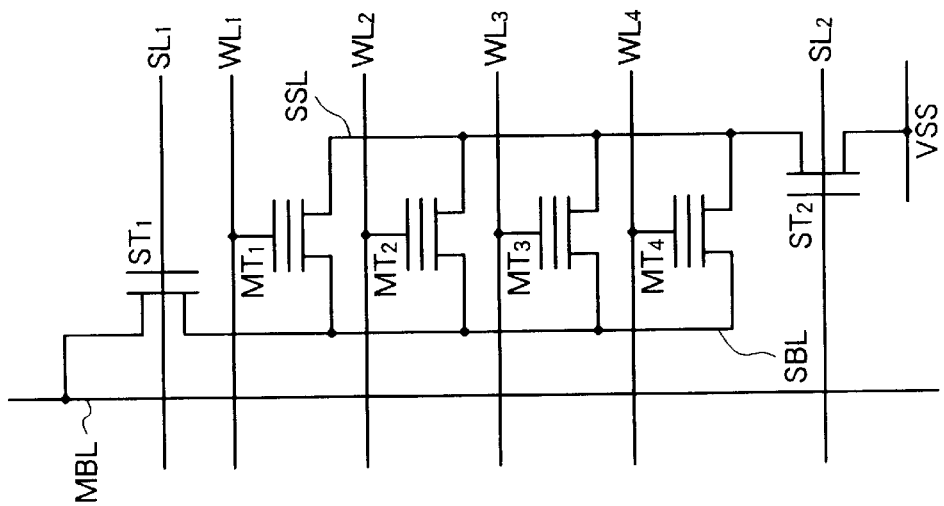
FIG. 2A is a view of a memory array of a DINOR type flash memory.

FIGS. 2A, 2B, and 2C are views of memory array constructions of a DINOR type, a NAND type, and an AND type flash memory.

The DINOR type flash memory of FIG. 2A shows, for convenience, a memory array wherein four memory transistors are connected to one sub bit line which is connected to one main bit line.

In FIG. 2A, MBL represents a main bit line, and SBL represents a sub bit line. The main bit line MBL and the sub bit line SBL are connected operatively through a select transistor $ST_1$ controlled by a select gate line SL.

The sub bit line SBL is arranged across four word lines $WL_1$ to $WL_4$. Four memory transistors $MT_1$ to $MT_4$ are arranged at the cross positions.

The NAND type flash memory of FIG. 2B shows, for convenience, a memory array in which four memory transistors are connected to one NAND type row which is connected to one bit line.

In FIG. 2B, BL represents a bit line connected to the NAND type row comprised of two select transistors $ST_1$ and $ST_2$ and four memory transistors $MT_1$ to $MT_4$ connected in series.

The select transistors $ST_1$ and $ST_2$ are respectively controlled by select gate lines $SL_1$ and $SL_2$, while the memory transistors $MT_1$ to $MT_4$ are controlled by word lines $WL_1$ to $WL_4$.

The AND type flash memory of FIG. 2C shows, for convenience, a memory array comprised of four memory transistors $MT_1$ to $MT_4$ connected to one sub bit line connected to one main bit line.

In FIG. 2C, MBL represents a main bit line, SBL represents a sub bit line, and SSL represents a sub source line. The main bit line MBL and the sub bit line SBL are connected operatively through a select transistor $ST_1$ controlled by a select gate line $SL_1$. Also, the sub source line SSL is connected operatively to a power source line VSS though a select transistor $ST_2$ controlled by a select gate line $SL_2$.

Four memory transistors $MT_1$ to $MT_4$ are arranged between the sub bit line SBL and the sub source line SSL and are controlled by word lines $WL_1$ to $WL_4$.

In semiconductor memories (DINOR type and AND type) having structures comprised of a plurality of sub bit lines connected to a main bit line of a semiconductor memory (NAND type) having a structure comprised of a plurality of NAND type rows connected to a bit line, the conventional method of providing redundancy in units of bit lines (or main bit lines) is not efficient.

Figure 3:
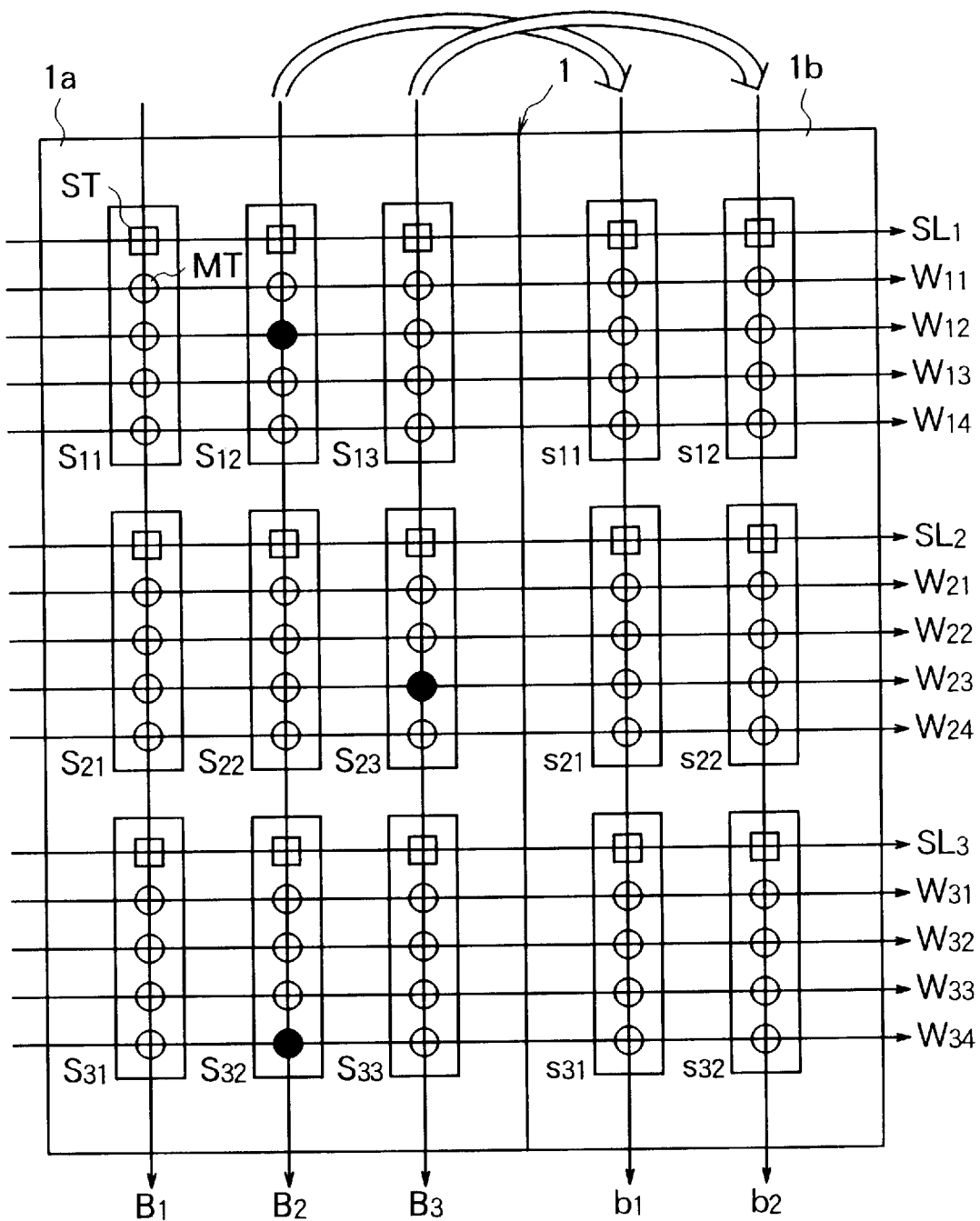

FIG. 3 is an explanatory view of an example of the efficiency of redundancy provided in units of main bit lines in a semiconductor nonvolatile memory having, for example, a DINOR type structure.

In FIG. 3, 1 represents a memory array constituted by a regular memory array 1a and a redundant memory array 1b.

Note that, FIG. 3, as a matter of convenience, illustrates an example in which three regular main bit lines $B_1$ to $B_3$ are arranged in the regular memory array 1a and two redundant main bit lines $b_1$ and $b_2$ are arranged in the redundant memory array 1b.

Each of the regular main bit lines $B_1$ to $B_3$ and the redundant main bit lines $b_1$ and $b_2$ are connected to three sub bit lines, and a memory row (sub bit line block) constituted by a select transistor (illustrated by □ in FIG. 3) and four memory transistors (illustrated by ○ in FIG. 3) is connected to each of the sub bit lines.

Namely, the regular memory array 1a is constituted by regular sub bit line blocks $S_{11}$ to $S_{33}$, while the redundant memory array 1b is constituted by redundant sub bit line blocks $s_{11}$ to $s_{32}$.

$SL_1$ to $SL_3$ represent select gate lines controlling the select transistors, while $WL_{11}$ to $WL_{34}$ represent word lines controlling the memory transistors.

In the example of FIG. 3, there is a defect in one memory cell (illustrated by ● in FIG. 3) in each of the regular sub bit line blocks $S_{12}$, $S_{23}$, and $S_{32}$.

In this case, the two regular main bit lines $B_2$ and $B_3$ are defective main bit lines. The chip is saved by replacing the defective main bit lines by the redundant main bit lines $b_1$ and $b_2$.

When providing redundancy in units of main bit lines, there is the following disadvantage.

In the example of FIG. 3, in the regular sub bit line blocks $S_{12}$, $S_{22}$, and $S_{32}$ connected to the defective main bit line $B_2$, $S_{12}$ and $S_{32}$ are defective, but $S_{22}$ is normal.

Also, in the regular sub bit line blocks $S_{13}$, $S_{23}$, and $S_{33}$ connected to the defective main bit line $B_3$, $S_{23}$ is defective, but $S_{13}$ and $S_{33}$ are normal.

Namely, since redundancy is provided in units of main bit lines, the normal sub bit line blocks are replaced too. As a result, the efficiency of redundancy is reduced. The reduction of the efficiency of redundancy becomes especially remarkable in a memory chip including a large number of defective memory transistors.

Figure 4:
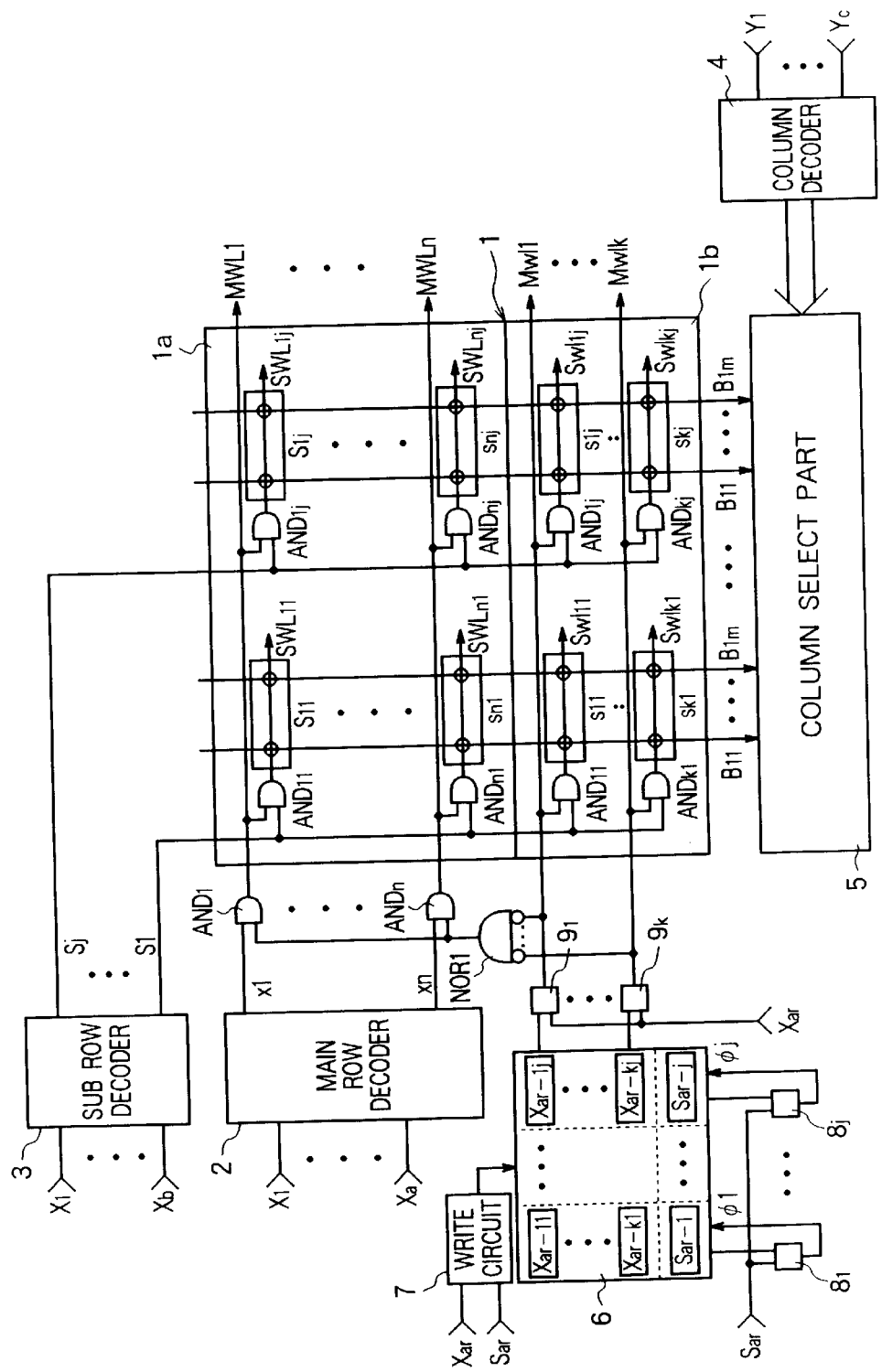
FIG. 4 is a circuit diagram of a first embodiment of a semiconductor memory according to the present invention.

FIG. 4 is a circuit diagram of a first embodiment of a semiconductor memory having a structure of a main word line divided into a plurality of sub word lines through an operative select means (that is, a divided word line structure) according to the present invention.

In FIG. 4, 1 represents a memory array constituted by a regular memory array 1a and a redundant memory array 1b.

In the memory array 1, n number of regular main word lines $MWL_1$ to $MWL_n$ are arranged in the regular memory array 1a, and k number of redundant main word lines $Mwl_1$ to $Mwl_k$ are arranged in the redundant memory array 1b, respectively.

Each of the regular main word lines $MWL_1$ to $MWL_n$ and the redundant main word lines $Mwl_1$ to $Mwl_k$ are divided into j number of regular sub word lines $SWL_{11}$ to $SWL_{nj}$ and j number of redundant sub word lines $Swl_{11}$ to $Swl_{kj}$, respectively.

Each of the sub word lines are arranged across four bit lines $B_{11}$ to $B_{jm}$. A memory row (sub word line block) constituted by m number of memory cells is connected to each of the sub bit lines.

Namely, the regular memory array 1a is constituted by regular sub word line blocks $S_{11}$ to $S_{nj}$, and the redundant memory array 1b is constituted by redundant sub word line blocks $s_{11}$ to $S_{kj}$.

$AND_{11}$ to $AND_{nj}$ in the regular memory array 1a represent AND circuits for connecting operatively between the regular main word lines $MWL_1$ to $MWL_n$ and the regular sub word lines $SWL_{11}$ to $SWL_{nj}$ and are selected operatively by select signals $S_1$ to $S_j$ from a sub row decoder (section decoder).

$AND_{11}$ to $AND_{kj}$ in the reductant memory array 1b represent AND circuits for connecting operatively between the regular main word lines $Mwl_1$ to $Mwl_k$ and the redundant sub word lines $Swl_1$ to $Swl_{kj}$ and are selected operatively by select signals $S_1$ to $S_j$ similarly.

Reference numeral 2 represents a main row decoder decoding high bits $X_1$ to $X_2$ of the X-inputs and then generating main word line select signals $x_1$ to $x_n$.

Reference numeral 3 represents a sub row decoder (section decoder) decoding low bits $X_1$ to $X_b$ of the X-input and then generating select signals $S_1$ to $S_j$ for selecting the sub word line blocks.

Reference numeral 4 represents a column decoder decoding the Y-inputs $Y_1$ to $Y_c$ and then generating a bit line select signal.

Reference numeral 5 represents a column select part selecting one of j×m number of bit lines $B_{11}$ to $B_{jm}$.

Reference numeral 6 represents a defect address memory part comprising an assembly of registers constituted by nonvolatile memory elements. The defect address memory array is provided for storing addresses of blocks containing defective memory cell(s) in the regular sub word line blocks $S_{11}$ to $Sn_{nj}$.

The address of a defective sub word line block is stored for every S-address (divided address). k number of X -(regular main word line) addresses are stored corresponding to j number of S-addresses (divided addresses).

Namely, the address of a defective sub word line block is stored in a register corresponding to a redundant sub word line block existing in a direction in which the same bit line extends.

In the figure, $S_{ar-1\ to\ Sar-j}$ represent the defect S-address registers, and $X_{ar-1}$ to $S_{ar-kj}$ represent the defect X-address registers.

Reference numeral 7 represent a write circuit writing an S- (divided) address $S_{ar}$ and a select address represented by the an X- (regular main word line) address $X_{ar}$ as a defect address.

Reference numerals $8_1$ to $8_j$ represent S-address coincidence judgement circuits. These store the defect S-addresses in registers provided corresponding to the j number of defect S-address registers $S_{ar-1}$ to $S_{ar-j}$. When a stored defect S-address coincides with an S-address $S_{ar}$ selected at present, they output defect X-address read signals $\phi_1$ to $\phi_j$.

When the X-address read signals $\phi_1$ to $\phi_j$ are output, the contents of the corresponding defect X-address registers $X_{ar-11}$ to $X_{ar-kj}$ are searched. When the defect X-address is stored, the defect X-address is output.

Reference numerals $9_1$ to $9_k$ represent X-address coincidence judgement circuits. These store the defect X-addresses in registers provided corresponding to k number of defect X-addresses $X_{ar-11}$ to $X_{ar-kj}$. When a stored defect X-address coincides with the X-address $X_{ar}$ selected at present, they select a voltage and then output the voltage to the corresponding redundant main word lines $Mwl_1$ to $Mwl_k$.

NOR1 represents a k-input NOR circuit. The input terminals are connected to output terminals of the X-address coincidence judgment circuits $9_1$ to $9_k$. The circuit obtains the non-conjunction of the output voltage signals of the X-address coincidence judgement circuits $9_1$ to $9_k$.

$AND_1$ to $AND_n$ represent two-input AND circuits. One of the input terminals of each is connected to an output line of the main word line select signal $x_1$ to $x_a$ of the main row decoder 2 and the other of the input terminals is connected to the output terminal of the NOR circuit NOR1. The circuit obtains the AND product between the main word line select signals $x_1$ to $x_a$ and an output signal of the NOR circuit NOR1.

Next, an explanation will be made of the operation of the above-mentioned configuration.

The high bits $X_1$ to $X_a$ of the X-inputs of the row address are input to the main row decoder 2 and decoded, and then the main word line select signals $x_1$ to $x_n$ are generated and output to the AND circuits AND1 to ANDn.

The low bits $X_1$ to $X_b$ of the X-inputs of the row addresses are input to the sub row decoder 3 and decoded, and then the select signals $S_1$ to $S_j$ for the selected sub word line blocks are generated and output to the AND circuits $AND_{11}$ to $AND_{nj}$ and $AND_{11}$ to $AND_{kj}$.

In the column decoder 4, the Y-inputs $Y_1$ to $Y_c$ of the column addresses are decoded and then the bit line select signal is generated and output to the column select part 5, whereupon one of the j×M number of bit lines $B_11$ to $B_{jm}$ indicated by the address is selected.

Here, when there is a defective memory cell in one of the regular sub word line blocks $S_{11}$ to $S_{nj}$, the address of the defective sub word line block is stored for each S-address (divided address) as a defect address and k number of X-(regular main word line) addresses are stored corresponding to each of the j number of S-addresses (divided addresses) in the defect address store part 6 by the write circuit 7.

When a stored defect S-address coincides with the S-address $S_{ar}$ selected at present, the defect X-address read signals $\phi_1$ to $\phi_j$ are output by the S-address coincidence judgement circuits $8_1$ to $8_j$.

When the defect X-address read signals $\phi_1$ to $\phi_j$ are output, the contents of the corresponding defect X-address registers $X_{ar-11}$ to $X_{ar-kj}$ are searched. When a defect X-address is stored, the defect X-address is output to the X-address coincidence judgement circuits $9_1$ to $9_k$ and stored in registers corresponding to the defect S-address.

In the X-address coincidence judgement circuits $9_1$ to $9_k$, when a defect X-address stored in the registers coincides with the X-address $X_{ar}$ selected at present, predetermined voltages are output to the corresponding redundant main word lines $Mwl_1$ to $Mwl_k$ selectively.

The signals of the redundant main word lines $Mwl_1$ to $Mwl_k$ are input to the NOR circuit NOR1. When any one of the redundant main word lines $Mwl_1$ to $Mwl_k$ is the high level, the output of the NOR circuit NOR1 becomes a low level. When all of the redundant main word lines $Mwl_1$ to $Mwl_k$ are the low level, the output of the NOR circuit NOR1 becomes the high level.

When the output of the NOR circuit NOR1 is the low level, the AND circuits $AND_1$ to $AND_n$ are deactivated and all of the output regular main word lines $MWL_1$ to $MWL_n$ become the low level.

Namely, the defective main word line connected the selected defective sub word line block is cut off and replaced by a redundant main word line.

When the output of the NOR circuit NOR1 is the high level, the AND circuits $AND_1$ to $AND_n$ are activated and one of the regular main word lines $MWL_1$ to $MWL_n$ is selected and output by the main row decoder 2.

Figure 5:
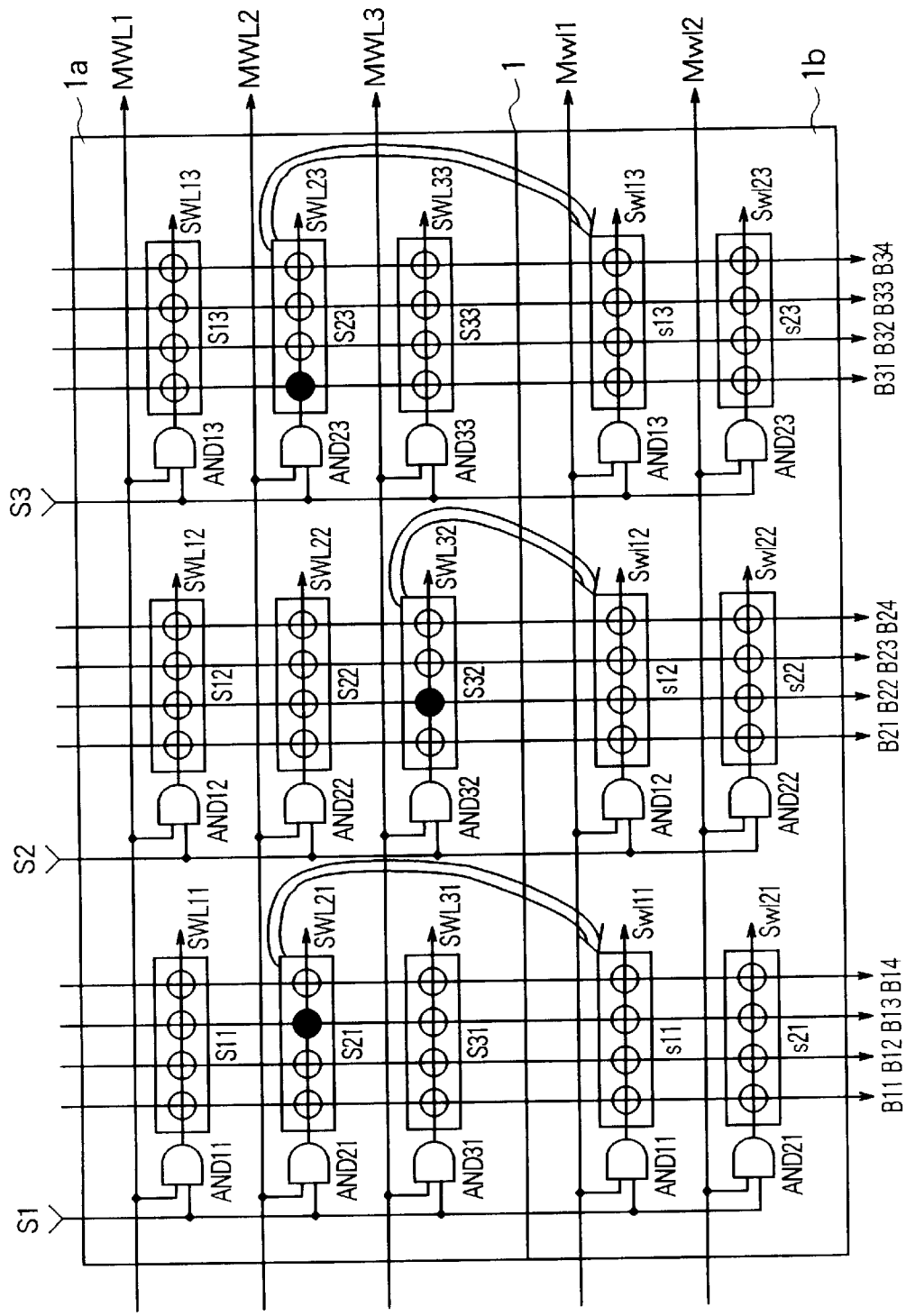
FIG. 5 is an explanatory view of a replacement of a defective cell in FIG. 4.

FIG. 5 is an explanatory view of an example of replacement of defective sub word lines.

The configuration of the memory array and the number and the arrangement of the defective memory cells are the same as in the above mentioned example of FIG. 1 showing the conventional efficiency of redundancy.

Namely, in the example of FIG. 5 too, there is a defect in one memory cell (illustrated by ● in FIG. 5) of each of the regular sub word line blocks $S_{21}$, $S_{23}$, and $S_{32}$.

In this case, the two regular main word lines $MWL_2$ and $MWL_3$ are the defective main word lines, but the chip is saved by replacing the defective main word lines with a single redundant main word line $Mwl_1$.

There is therefore a large increase of efficiency of redundancy in comparison with the case of replacing two defective main word lines $MWL_2$ and $MWL_3$ with two redundant main word lines $Mwl_1$ and $Mwl_2$ as when providing redundancy in units of main word lines as shown in FIG. 1.

Figure 6:
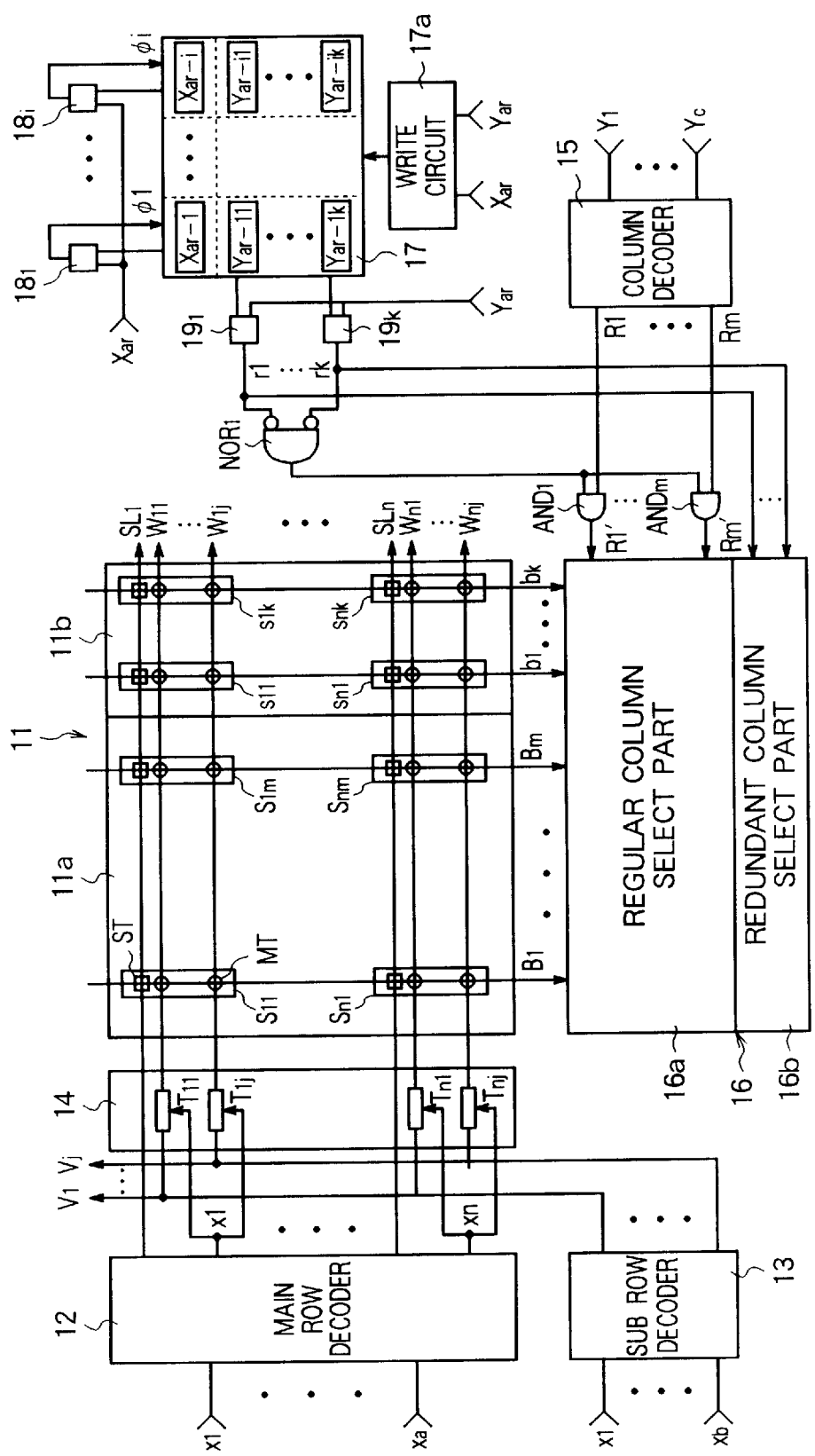
FIG. 6 is a circuit diagram of a second embodiment of a semiconductor memory according to the present invention.

FIG. 6 is a circuit diagram of a second embodiment of a semiconductor memory, for example, a DINOR type flash memory with a main bit line connected to a plurality of sub bit lines through operative select means according to the present invention.

In FIG. 6, 11 represents a memory array constituted by a regular memory array 11a and a redundant memory array 11b.

In the memory array 11, M number of regular main bit lines $B_1$ to $B_m$ are arranged in the regular memory array 11a, and k number of redundant main bit lines $b_1$ to $b_k$ are arranged in the redundant memory array 11b, respectively.

Each of the regular main bit lines $B_1$ to $B_m$ and the redundant main bit lines $b_1$ to $b_k$ are connected to n number of sub bit lines.

Each of the sub bit lines is connected to a memory row (sub word line block) constituted by a select transistor (illustrated by □ in FIG. 6) and j number of memory cells (illustrated by ○ in FIG. 6).

Namely, the regular memory array 11a is constituted by regular sub bit line blocks $S_{11}$ to $S_{nm}$, and the redundant memory array 11b is constituted by redundant sub bit line blocks $s_{11}$ to $S_{nk}$.

$SL_1$ to $SL_n$ represent select gate lines controlling the select transistors, and $WL_{11}$ to $WL_{nj}$ represent word lines for controlling the memory transistors.

Reference numeral 12 represents a main row decoder decoding high bits $X_1$ to $X_a$ of X-inputs and generating output voltages of the select gate lines $SL_1$ to $SL_n$ and sub bit line select signals $x_1$ to $x_n$.

Reference numeral 13 represents a sub row decoder decoding low bits $X_1$ to $X_b$ of the X-inputs and generating word line voltages $V_1$ to $V_j$ for selected sub bit line blocks.

Reference numeral 14 represents a local decoder constituted by transmission circuits $T_{11}$ to $T_{nj}$ corresponding to each of the word lines $WL_{11}$ to $WL_{nj}$ and selected in block units by the sub bit line block select signals $x_1$ to $x_n$.

When the transmission circuits $T_{11}$ to $T_{nj}$ are selected by the sub bit line block select signals, the transmission circuits $T_{11}$ to $T_{nj}$ output the word line voltages $V_1$ to $V_j$ to the corresponding word lines. When the transmission circuits $T_{11}$ to $T_{nj}$ are not selected by the sub bit line block select signals, the transmission circuits $T_{11}$ to $T_{nj}$ output a suitable voltage (for example, ground voltage GND) corresponding to the operation to the corresponding word lines.

Reference numeral 15 represents a column decoder for decoding the Y-inputs $Y_1$ to $Y_c$ and then generating regular column select signals $R_1$ to $R_m$ corresponding to the regular main bit lines $B_1$ to $B_m$.

Reference numeral 16 represents a column select part constituted by a regular column select part 16a and a redundant column select part 16b.

The regular column select part 16a selects one of m number of regular main bit lines $B_1$ to $B_m$. The redundant column select part 16b selects one of the k number of redundant main bit lines $b_1$ to $b_k$.

Reference numeral 17 represents a defect address memory part comprised of an assembly of registers constituted by nonvolatile memory elements. The defect address memory part 17 is provided for storing addresses of blocks containing defective memory cells (memory transistors) in the regular sub word line blocks $S_{11}$ to $S_{nm}$.

The address of a defective sub word line block is stored for each address (divided address) in the word line direction. k number of Y- (bit line) addresses are stored corresponding to i ($i \leq n$) number of X- (word line direction) addresses.

Namely, the address of a defective sub bit line block is stored in a register corresponding to the redundant sub bit line block existing in a direction in which the same word line extends.

In the figure, $X_{ar-1}$ to $X_{ar-i}$ represent the defect X-address resisters, and $Y_{ar-1}$ to $Y_{ar-ik}$ represent the defect Y-address registers.

Reference numeral 17a represents a write circuit for writing an X- (word line direction) address $X_{ar}$ and a select address represented by the Y- (bit line) address ($Y_{ar}$) as a defect address.

Reference numerals $18_1$ to $18_i$ represent X-address coincidence judgement circuits provided corresponding to the i number of defect X-address registers $X_{ar-1}$ to $X_{ar-i}$. When a stored defect X-address coincides with the X-address $X_{ar}$ selected at present, they output the defect Y-address read signals $\phi_1$ to $\phi_j$.

When the defect Y-address read signals $\phi_1$ to $\phi_j$ are output, the contents of the corresponding defect Y-address registers ($Y_{ar-11}$ to $Y_{ar-ik}$) are searched. When the defect Y-address is stored, the defect Y-address is output.

Reference numerals $19_1$ to $19_k$ represent Y-address coincidence judgement circuits for storing defect Y-addresses into registers provided corresponding to k number of defect Y-address registers $Y_{ar-1}$ to $Y_{ar-i}$. When a stored defect Y-address coincides with the Y-address $Y_{ar}$ selected at present, they output the redundant column select signals $r_1$ to $r_k$.

NOR1 represents a k-input NOR circuit. The input terminals are connected to output terminals of the Y-address coincidence judgment circuits $19_1$ to $19_k$. The circuit obtains the non-conjunction of the k number of redundant column select signal $r_1$ to $r_k$.

$AND_1$ to $AND_n$ represent two-input AND circuits. One of the input terminals of each is connected to an output line of one of the regular column select signals $R_1$ to $R_m$ of the column decoder 15, while the other of the input terminals is connected to the output terminal of the NOR circuit NOR1. These obtain the AND product between the two signals.

Next, an explanation will be made of the operation of the above mentioned configuration.

The high bits $X_1$ to $X_a$ of the X-inputs of the row address are input to the main row decoder 12 and decoded, and then the output voltages of the select gate lines $SL_1$ to $SL_2$ and the sub bit line select signals $x_1$ to $x_n$ are generated in the main row decoder 12. The output voltages are supplied to the predetermined select gate lines, and the sub bit line block select signals $x_1$ to $x_n$ are output to the local decoder 14.

The low bits $X_1$ to $X_b$ of the X-inputs of the row addresses are input to the sub row decoder 13 and decoded, and then the word line voltages $V_1$ to $V_j$ for the selected sub bit line blocks are generated.

In the local decoder 14, the transmission circuits $T_{11}$ to $T_{nj}$ corresponding to each of the word lines $WL_{11}$ to $WL_{nj}$ are selected by the sub bit line block select signals $x_1$ to $x_n$. Then the word line voltages $V_1$ to $V_j$ are output to the corresponding word lines through the selected transmission circuits.

When the transmission circuits $T_{11}$ to $T_{nj}$ are not selected by the sub bit line block select signals, for example, the ground voltage GND is output to the corresponding word lines.

In the column decoder 15, the Y-inputs $Y_1$ to $Y_c$ of the column addresses are decoded, then the regular column select signals $R_1$ to $R_m$ corresponding to the regular main bit lines $B_1$ to $B_m$ are generated and output to the AND circuits $AND_1$ to $AND_m$.

Here, when there is a defective memory cell (memory transistor) in the regular sub bit line blocks $S_1$ to $S_{nm}$ the select address represented by the X-(word line direction) address $X_{ar}$ and Y- (bit line) address $Y_{at}$ is stored as a defect address in the defect address memory part 17 by the write circuit 17a.

When a stored defect X-address coincides with the X-address $X_{ar}$ selected at present, the defect Y-address read signals $\phi_1$ to $\phi_i$ are output by the X-address coincidence judgement circuits $18_1$ to $18_i$.

When the defect Y-address read signals $\phi_1$ to $\phi_i$ are output, the contents of the corresponding defect Y-address registers $Y_{ar-11}$ to $Y_{ar-ik}$ are searched. When a defect Y-address is stored, the defect Y-address is output to the Y-address coincidence judgement circuits $19_1$ to $19_k$ and stored in the register corresponding to the defect address.

In the Y-address coincidence judgement circuits $19_1$ to $19_k$, when a defect Y-address stored in the registers coincides with the Y-address $Y_{ar}$ selected at present, the redundant column select signals $r_1$ to $r_k$ are output at the high level. When there is no coinciding defect Y-address, they are output at the low level.

The redundant column select signals $r_1$ to $r_k$ are input to the NOR circuit NOR1. When any one of the redundant column select signals $r_1$ to $r_k$ is the high level, the output of the NOR circuit NOR1 becomes a low level. When all of the redundant column select signals $r_1$ to $r_k$ are the low level, the output of the NOR circuit NOR1 becomes the high level.

When the output of the NOR circuit NOR1 is the low level, the AND circuits $AND_1$ to $AND_m$ are deactivated and all of the output regular column select signals $R_1'$ to $R_m'$ become the low level.

Namely, the defective main bit line connected to the selected defective sub bit line block is cut off and replaced by a redundant main bit line.

When the output of the NOR circuit NOR1 is the high level, the AND circuits $AND_1$ to $AND_m$ are activated and the regular main bit lines are selected by the output regular column select signals $R_1'$ to $R_m'$.

Figure 7:
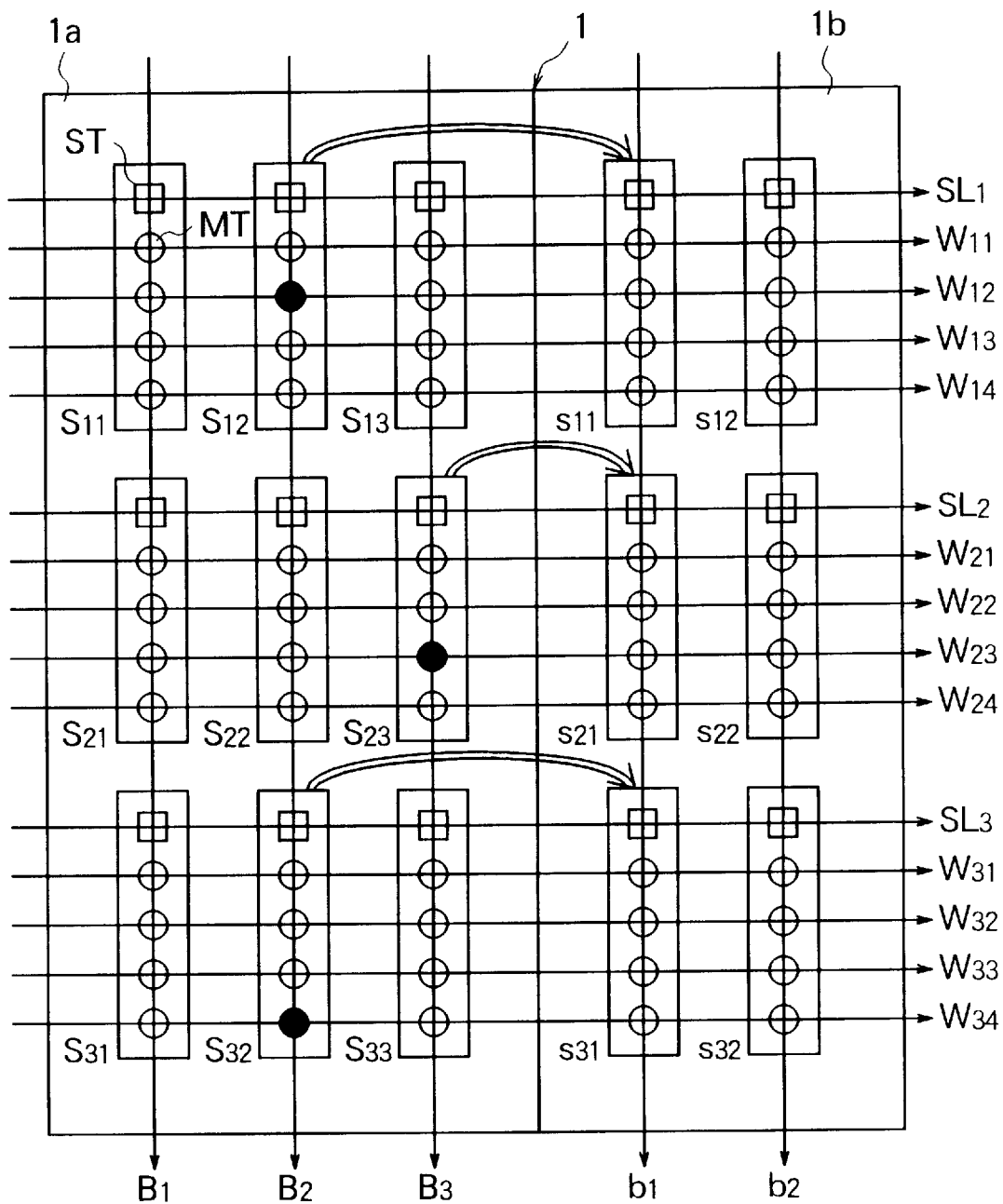
FIG. 7 is an explanatory view of replacement of a defective cell in FIG. 6.

FIG. 7 is an explanatory view of an example of replacement of defective cells in the semiconductor nonvolatile memory of FIG. 6 according to the present invention.

The configuration of the memory array and the number and the arrangement of the defective memory cells of FIG. 7 are the same as in the above mentioned example of FIG. 3 showing the conventional efficiency of redundancy.

Namely, in the example of FIG. 7 too, there is a defect in one memory cell (illustrated by ● in FIG. 7) of each of the regular sub bit line blocks $S_{21}$, $S_{23}$, and $S_{32}$.

In this case, the two regular main bit lines $B_2$ and $B_3$ are the defective main bit lines. The chip is saved by replacing the defective main bit lines with a single redundant main bit line $b_1$.

There is therefore a large increase of efficiency of redundancy in comparison with the case of replacing two defective main bit lines $B_2$ and $B_3$ with two redundant main bit lines $b_1$ and $b_2$ as in the case of providing the redundancy in units of the main bit lines as shown in FIG. 3.

Figure 8:
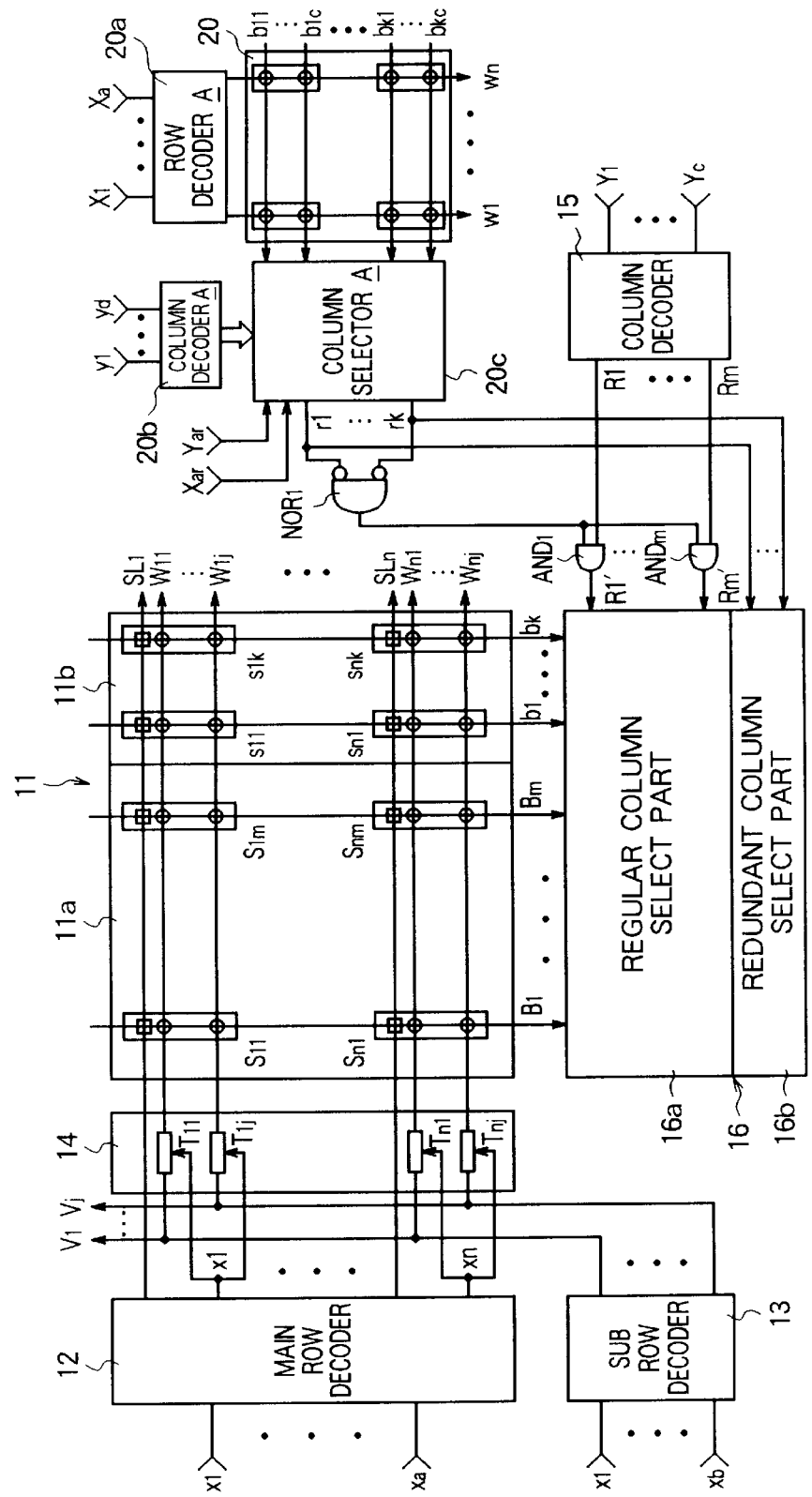
FIG. 8 is a circuit diagram of a third embodiment of a semiconductor memory according to the present invention.

FIG. 8 is a circuit diagram of a third embodiment of a semiconductor memory, for example, a DINOR type flash memory with a main bit line connected to a plurality of sub bit lines through operative select means according to the present invention.

The difference of the third embodiment from the second embodiment of FIG. 6 is that the defect address is not stored in registers constituted by nonvolatile memory elements, but another semiconductor nonvolatile memory integrated separately from the semiconductor nonvolatile memory according to the present invention.

Due to storing the defect addresses in another semiconductor memory other than the semiconductor nonvolatile memory according to the present invention, when there are a plurality of defective memory transistors in the memory array, it becomes easier to store the addresses of the defective sub bit line blocks.

Namely, there is the advantage for reducing the area of the defect address memory part occupied even when it is necessary to store a plurality of defect addresses.

In FIG. 8, 20 represents a memory array of the other semiconductor nonvolatile memory for storing the defect addresses.

In the memory array 20, n number of word lines $w_1$ to $w_n$ are arranged corresponding to n number of word line blocks, and (k•c) number of bit lines $b_{11}$ to $b_{kc}$ are arranged corresponding to k number of redundant main bit lines and c number of Y-inputs.

At each of the lattice points between the word lines and the bit lines, electrically programmable memory cells (illustrated by ○ in FIG. 8), for example, EEPROMs, are arranged.

c number of memory cells corresponding to c number of Y-inputs comprise memory rows (Y-address rows).

Namely, the memory array 20 is constituted by the Y-address rows $S_{11}$ to $S_{nk}$.

Accordingly, the addresses of defective sub bit line blocks are stored for every word line direction address. k number of Y- (bit line) addresses are stored corresponding to n number of X- (word line direction) addresses.

Namely, the addresses of the defective sub bit line blocks are stored in the Y-address rows corresponding to the redundant sub bit line blocks existing in a direction in which the same word line extends.

Reference numeral 20a represents a row decoder A for decoding high bits $X_1$ to $X_a$ of the X-inputs and then outputting suitable voltages corresponding to the operation to the word lines $w_1$ to $w_n$.

Reference 20b represents a column decoder A for decoding the Y-inputs $Y_1$ to $Y_d$ and then generating a signal for selecting the k number of Y- (bit line) addresses.

Reference numeral 20c represents a column select part not only having the function of a write circuit for storing the select address represented by the X-address $X_{ar}$ and Y-address $Y_{ar}$ selected at present into the memory array 20 as the defect address, but also having the function of outputting the redundant column select signals $r_1$ to $r_k$ at the high level when a defect address coinciding with the select address is stored in the memory array.

The redundant column select signals $r_1$ to $r_k$ are input to the NOR circuit NOR1. When any one of the redundant column select signals $r_1$ to $r_k$ is the high level, the output of the NOR circuit NOR1 becomes the low level. When all of the redundant column select signals $r_1$ to $r_k$ are the low level, the output of the NOR circuit NOR1 becomes the high level.

When the output of the NOR circuit NOR1 is the low level, the AND circuits $AND_1$ to $AND_m$ are deactivated and all of the output regular column select signals $R_1'$ to $R_m'$ become the low level.

Namely, the defective main bit line connected to the selected defect sub bit line block is cut off and replaced by a redundant main bit line.

When the output of the NOR circuit NOR1 is the high level, the AND circuits $AND_1$ to $AND_m$ are activated and the regular main bit line is selected by the output regular column select signals $R_{1'}$ to $R_{m'}$.

As explained above, according to the present embodiment, there is provided a semiconductor nonvolatile memory (for example, a DINOR type flash memory) having a structure of a plurality of sub bit lines connected to a main bit line, wherein a chip with defective memory transistors is saved by providing redundancy not in units of main bit lines, but sub bit lines, so it is possible to achieve a high efficiency of redundancy.

Note that, while the present embodiment was explained with reference to a DINOR type flash memory, needless to say the present invention may also be applied to a method of providing redundancy to save a memory chip with defective memory transistors not in units of main bit lines, but in units of NAND rows in a semiconductor nonvolatile memory (for example, a NAND type flash memory) having a structure of a plurality of NAND rows connected to a bit line.

Further, needless to say the present invention may also be applied not only for facilitating the saving of defective chips at the time of shipment of products, but also saving defective chips at rewrite operations in a repeatedly rewritable flash memory or the like.

Further, needless to say the present invention may also be applied to not only a nonvolatile semiconductor memory, but also a volatile semiconductor memory such as a SRAM or a DRAM.

Many widely different embodiments of the present invention may be constructed without departing from the scope of the invention. It is understood that the present invention is not restricted to the specific embodiments described above.

What is claimed is:

1. A semiconductor memory which has a divided word line structure in which a main word line is divided into a plurality of sub word lines and which has memory cells at cross points between the main word line and bit line, comprising:

at least one redundant main word line to which a plurality of redundant sub word lines are selectively connected, a defect address memory means for storing an address of a defective sub word line containing a defective memory cell, and a saving means for replacing a sub word line with a redundant sub word line existing in a direction in which the same bit line extends when the address of a memory cell connected to the sub word line coincides with an address stored in the defect address memory means.

2. A semiconductor memory according to claim 1, wherein the saving means has a selective main word line replacing means for replacing a defective main word line to which a defective sub word line is connected by a redundant main word line when a defective sub word line having the same address as a defect address stored in the defect address memory means is selected and not replacing the defective main word line when a sub word line having a different address from the defect addresses is selected.

3. A semiconductor memory according to claim 1, wherein the defect address memory means is constituted by a nonvolatile memory device.

4. A semiconductor memory according to claim 1, wherein the memory array part and the defect address memory means are integrated separately.

5. A semiconductor memory according to claim 1, wherein the defect address is recorded at the time of shipment of the products.

6. A semiconductor memory according to claim 1, wherein the semiconductor is rewritable and the defect address is recorded at every rewrite operation.

7. A semiconductor memory which has a divided bit line structure in which a main bit line is divided into a plurality of sub bit lines and which has memory cells at cross points between the main bit line and word lines, comprising:

at least one redundant main bit line to which a plurality of redundant sub bit lines are selectively connected, a defect address memory means for storing an address of a defective sub bit line containing a defective memory cell, and a saving means for replacing a sub bit line by a redundant sub bit line existing in a direction in which the same word line extends when an address of a memory cell connected to the sub bit line coincides with an address stored in the defect address memory means.

8. A semiconductor memory according to claim 7, wherein the saving means has a selective main bit line replacing means for replacing a defective main bit line to which a defective sub bit line is connected by a redundant main bit line when a defective sub bit line having the same address as a defect address stored in the defect address memory means is selected and not replacing the defective main bit line when a sub bit line having a different address from the defect addresses is selected.

9. A semiconductor memory according to claim 7, wherein the defect address memory means is constituted by a nonvolatile memory device.

10. A semiconductor memory according to claim 7, wherein the memory array part and the defect address memory means are integrated separately.

11. A semiconductor memory according to claim 7, wherein the defect address is recorded at the time of shipment of the products.

12. A semiconductor memory according to claim 7, wherein the semiconductor is rewritable and the defect addresses are recorded every rewrite operation.

13. A semiconductor memory comprising a plurality of NAND rows having a NAND structure connected to bit lines arranged in rows and memory transistors arranged in a matrix connected to the NAND rows and word lines, comprising:

at least one redundant bit line to which a plurality of redundant NAND rows are connected, a defect address memory means for storing an address of a defective sub NAND row containing a defective memory cell, and a saving means for replacing a NAND row by a redundant NAND row existing in a direction in which the same word line extends when there is a defect in the memory cells connected to the NAND row.

14. A semiconductor memory according to claim 13, wherein the saving means has a selective main word line replacing means for replacing a defective main bit line to which a NAND row is connected by a redundant main bit line when a NAND row having the same address as a defective address stored in the defect address memory means is selected and not replacing the defective bit line when a NAND row having a different address from the defective addresses is selected.

15. A semiconductor memory according to claim 13, wherein the defect address memory means is constituted by a nonvolatile memory device.

16. A semiconductor memory according to claim 13, wherein the memory array part and the defect address memory means are integrated separately.

17. A semiconductor memory according to claim 13, wherein the defect address is stored at the time of shipment of the products.

18. A semiconductor memory according to claim 13, wherein the semiconductor is rewritable and the defect address is recorded at every rewrite operation.

* * * * *